(12) United States Patent
Yoshida et al.

(10) Patent No.: US 11,322,605 B2
(45) Date of Patent: May 3, 2022

(54) SEMICONDUCTOR DEVICE

(71) Applicant: FUJI ELECTRIC CO., LTD., Kanagawa (JP)

(72) Inventors: Soichi Yoshida, Matsumoto (JP); Kenichiro Sato, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/183,397

(22) Filed: Feb. 24, 2021

(65) Prior Publication Data

US 2021/0184024 A1 Jun. 17, 2021

Related U.S. Application Data

(63) Continuation of application No. PCT/JP2020/003773, filed on Jan. 31, 2020.

(30) Foreign Application Priority Data

Mar. 15, 2019 (JP) .............................. JP2019-048290

(51) Int. Cl.
*H01L 29/739* (2006.01)
*H01L 27/06* (2006.01)
(Continued)

(52) U.S. Cl.
CPC ...... *H01L 29/7397* (2013.01); *H01L 27/0635* (2013.01); *H01L 27/0761* (2013.01); *H01L 29/4236* (2013.01)

(58) Field of Classification Search
CPC ............. H01L 27/0761; H01L 27/0635; H01L 29/7397; H01L 29/4236
See application file for complete search history.

(56) References Cited

U.S. PATENT DOCUMENTS 10,559,663 B2 2/2020 Naito
2015/0311285 A1 10/2015 Momota
(Continued)

FOREIGN PATENT DOCUMENTS

JP 2013080796 A 5/2013
JP 2014053552 A 3/2014
(Continued)

OTHER PUBLICATIONS (ISA/237) Written Opinion of the International Search Authority for International Patent Application No. PCT/JP2020/003773, issued/mailed by the Japan Patent Office dated Apr. 7, 2020.

*Primary Examiner* — Joseph C. Nicely

(57) ABSTRACT

A semiconductor device is provided, which includes: a semiconductor substrate; an emitter electrode including at least two partial electrodes arranged with an interval in a top plan view of the semiconductor substrate; and an active-side gate runner and an active-side dummy runner arranged to be sandwiched between two of the partial electrodes, wherein the semiconductor substrate includes: a gate trench portion connected to the active-side gate runner and having a longitudinal length in a first direction in the top plan view, and a dummy trench portion connected to the active-side dummy runner and having a longitudinal length in the first direction, wherein the entirety of one of the active-side gate runner and the active-side dummy runner in the first direction is covered by the other of the gate runner and the dummy runner.

20 Claims, 12 Drawing Sheets

(51) Int. Cl.
*H01L 29/423* (2006.01)
*H01L 27/07* (2006.01)

(56) References Cited

U.S. PATENT DOCUMENTS

2016/0020310 A1    1/2016  Shiga
2019/0221658 A1*   7/2019  Yoneda ............... H01L 29/7397

FOREIGN PATENT DOCUMENTS

| JP | 2015207736 A | 11/2015 |
| JP | 2016025124 A | 2/2016 |
| JP | 2018174295 A | 11/2018 |

* cited by examiner

SEMICONDUCTOR DEVICE

The contents of the following Japanese patent applications are incorporated herein by reference:
NO. 2019-048290 filed on Mar. 15, 2019, and
NO. PCT/JP2020/003773 filed on Jan. 31, 2020.

BACKGROUND

1. Technical Field

The present invention relates to a semiconductor device.

2. Related Art

Conventionally, in a semiconductor device including a gate trench and a dummy trench, a configuration for providing a runner for screening of the dummy trench is known (for example, see Patent documents 1 to 3).

PRIOR ART DOCUMENTS

Patent Documents

[Patent document 1] Japanese Patent Application Publication No. 2016-25124
[Patent document 2] Japanese Patent Application Publication No. 2015-207736
[Patent document 3] Japanese Patent Application Publication No. 2014-53552
[Patent document 4] Japanese Patent Application Publication No. 2018-174295

Technical Problem

If the runner for screening is provided in an active portion where a device such as a transistor formed, the area in which the device such as the transistor can be arranged becomes smaller.

General Disclosure

In order to solve the above described problem, one aspect of the present invention provides a semiconductor device including a semiconductor substrate. The semiconductor device may include an emitter electrode including at least two partial electrodes arranged with an interval in a top plan view of the semiconductor substrate. The semiconductor device may include an active-side gate runner and an active-side dummy runner. The active-side gate runner and the active-side dummy runner may be arranged to be sandwiched between two of the partial electrodes. The semiconductor substrate may include a gate trench portion connected to the active-side gate runner and having a longitudinal length in a first direction in the top plan view. The semiconductor substrate may include a dummy trench portion connected to the active-side dummy runner and having a longitudinal length in the first direction. The entirety of one of the active-side gate runner and the active-side dummy runner in the first direction may be covered by the other of the active-side gate runner and the active-side dummy runner.

The entirety of the active-side gate runner in the first direction may be covered by the active-side dummy runner arranged above the active-side gate runner.

The active-side dummy runner may be connected to the dummy trench portion at a portion that does not overlap the active-side gate runner.

The active-side gate runner may be a runner made of a semiconductor material, and the active-side dummy runner may be a runner made of a metal material.

The emitter electrode may have a bridge portion connecting two of the partial electrodes. The active-side dummy runner may be divided into at least two partial runners by the bridge portion. The semiconductor device may include an intersecting dummy runner made of a semiconductor material, which is provided intersecting with the bridge portion and connects two of the partial runners.

The intersecting dummy runner may be connected to the dummy trench portion.

The semiconductor substrate may have a transistor portion in which the gate trench portion and the dummy trench portion are provided and a diode portion in which the dummy trench portion is provided. The intersecting dummy runner may be connected to the dummy trench portion of the diode portion.

The dummy trench portion of the transistor portion may be connected to the active-side dummy runner.

The active-side gate runner may be provided intersecting with the bridge portion.

The semiconductor device may include an interlayer dielectric film. The interlayer dielectric film may be provided between the semiconductor substrate and the emitter electrode. The interlayer dielectric film may have a contact hole connecting the emitter electrode to the semiconductor substrate. The active-side dummy runner may be provided in a range that does not overlap with the contact hole in the top plan view of the semiconductor substrate.

The semiconductor device may include an outer circumferential gate runner. The outer circumferential gate runner may be arranged between the emitter electrode and an edge side of the semiconductor substrate in the top plan view. The outer circumferential gate runner may be connected to the active-side gate runner. The semiconductor device may include an outer circumferential dummy runner. The outer circumferential dummy runner may be arranged between the emitter electrode and the edge side of the semiconductor substrate in the top plan view. The outer circumferential dummy runner may be connected to the active-side dummy runner. The outer circumferential gate runner and the outer circumferential dummy runner may be arranged without overlapping with each other in the top plan view of the semiconductor substrate.

The semiconductor device may include a screening pad connected to the outer circumferential dummy runner.

The summary clause does not necessarily describe all necessary features of the embodiments of the present invention. The present invention may also be a sub-combination of the features described above.

DESCRIPTION OF EXEMPLARY EMBODIMENTS

Figure 1:
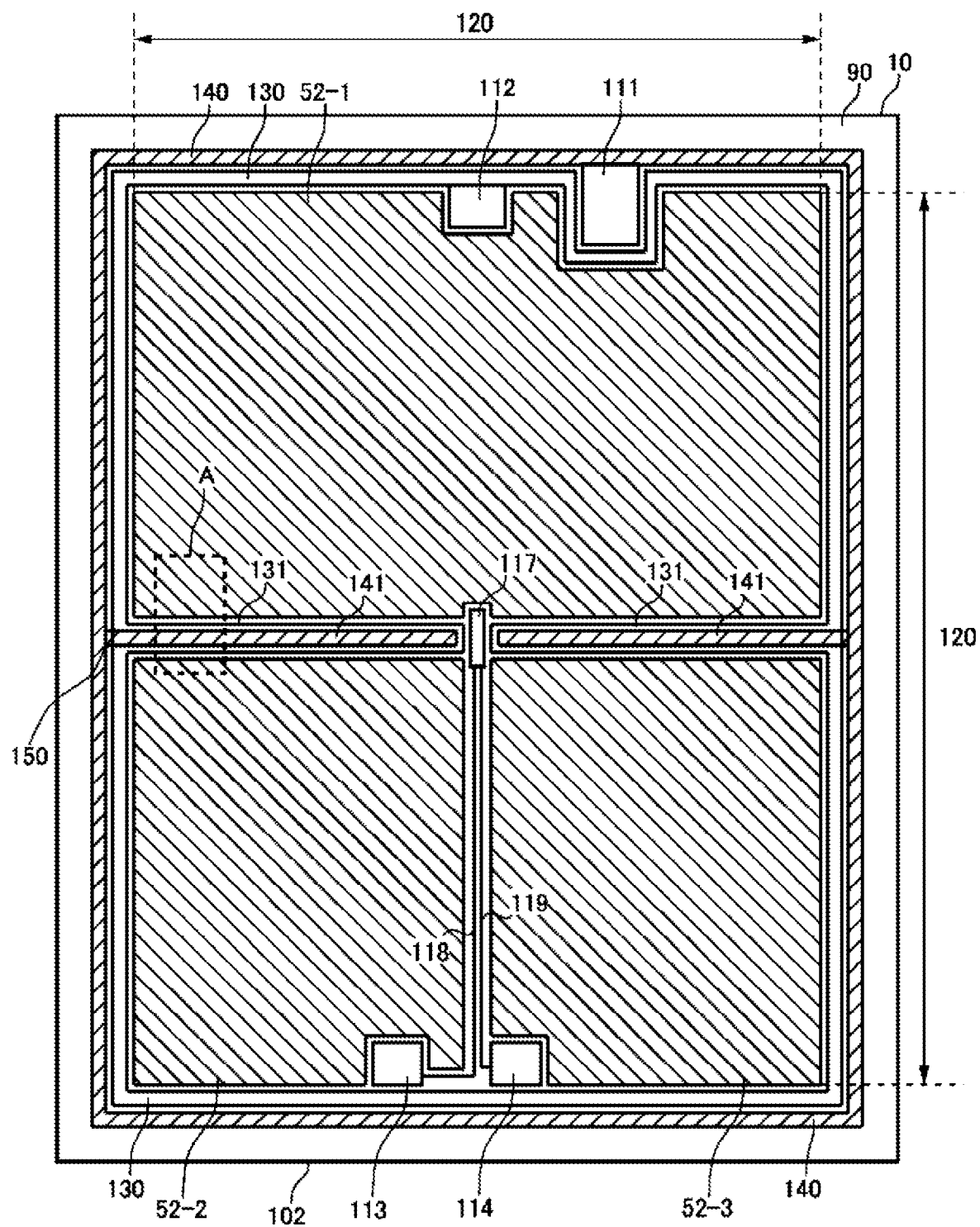
FIG. 1 is a top plan view showing an example of a semiconductor device 100 according to one embodiment of the present invention.

The present invention will now be described using embodiments of the invention. The following embodiments are not to limit the invention according to the appended claims. In addition, all of the combinations of the features described in the embodiments are not necessarily required in the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which the semiconductor device is mounted.

In the present specification, technical matters may be described using orthogonal coordinate axes of an X axis, a Y axis, and a Z axis. The orthogonal coordinate axes are only to specify relative positions of components, and shall not limit them to specific directions. For example, the Z axis shall not exclusively indicate a height direction relative to the ground. Note that a +Z axis direction and a −Z axis direction are directions opposite to each other. When the Z axis direction is described without describing the signs, it means that the direction is parallel to the +Z axis and the −Z axis. Further, in the present specification, a case of viewing from the +Z axis direction may be referred to as a top plan view.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. Note that conductivity types of respective doping regions may be of opposite polarities, respectively. Further, in the present specification, a description of a P+ type or an N+ type means a higher doping concentration than that of the P type or the N type, and a description of a P− type or an N− type means a lower doping concentration than that of the P type or the N type.

In the present specification, the doping concentration indicates a concentration of an impurity activated as a donor or an acceptor. In the present specification, a concentration difference between the donor and the acceptor may be referred to as a doping concentration. The concentration difference can be measured by the capacitance-voltage profiling method (CV method). In addition, a carrier concentration measured by a spreading resistance profiling method (SR) may be used as the doping concentration. In a case where a doping concentration distribution has a peak in a region, the peak value may be used as the doping concentration in the region. In a case where the doping concentration in a region where the donor or the acceptor exist is almost even, or the like, an average value of the doping concentration may be used as the doping concentration in the corresponding region. In addition, the dopant concentration in the present specification indicates a concentration of each of the donor and the acceptor.

FIG. 1 is a top plan view showing an example of a semiconductor device 100 according to one embodiment of the present invention. FIG. 1 shows positions at each of which each member is projected on an upper surface of a semiconductor substrate 10. In FIG. 1, only some members of the semiconductor device 100 are shown, while some members are omitted.

The semiconductor device 100 includes the semiconductor substrate 10. The semiconductor substrate 10 is a substrate formed of a semiconductor material such as silicon or a compound semiconductor. The semiconductor substrate 10 has an edge side 102 in the top plan view. When merely referred to as the top plan view in the present specification, it means that the semiconductor substrate 10 is viewed from an upper surface side. The semiconductor substrate 10 of the present example has two sets of edge sides 102 opposite to each other in the top plan view. In FIG. 1, the X axis and the Y axis are parallel to any of the edge sides 102. Further, the Z axis is perpendicular to the upper surface of the semiconductor substrate 10.

The semiconductor substrate 10 is provided with an active portion 120. The active portion 120 is a region where a main current flows in the depth direction between the upper surface and a lower surface of the semiconductor substrate 10 in a case where the semiconductor device 100 is controlled to be in an ON state. An emitter electrode 52 is provided above the active portion 120. In FIG. 1, the emitter electrode 52 is hatched with diagonal lines.

In the example of FIG. 1, the emitter electrode 52 has three partial electrodes 52-1, 52-2, and 52-3. Each of the partial electrodes is a part of the emitter electrode 52. The plurality of partial electrodes may be separated from each other or may be connected to each other. The active portion 120 may refer to a region that overlaps with the emitter electrode 52 in the top plan view. In the present example, the active portion 120 also includes a region sandwiched by the emitter electrode 52 in the top plan view. The active portion 120 of the present example may be a rectangular region circumscribing the emitter electrode 52 in the top plan view.

The active portion 120 is provided with a transistor portion including a transistor device such as an IGBT. The active portion 120 may further be provided with a diode portion including a diode device such as a FWD. A gate trench portion and a dummy trench portion are provided on the upper surface of the semiconductor substrate 10 in the active portion 120. The gate trench portion is configured to function as a gate electrode to which a gate potential is applied in the transistor portion. The dummy trench portion is provided in the transistor portion or the diode portion, and an emitter potential is applied to the dummy trench portion. The dummy trench portion is electrically connected to the emitter electrode.

The semiconductor device 100 may have one or more pads above the semiconductor substrate 10. The semiconductor device 100 of the present example has a gate pad 111, a screening pad 112, an anode pad 113, and a cathode pad 114. In addition, a pad for current detection or the like may be provided. When the semiconductor device 100 is mounted, each pad may be connected to an external circuit via a wiring such as a wire.

A gate potential is applied to the gate pad 111. The gate pad 111 is electrically connected to a conductive portion of a gate trench portion of the active portion 120. The semiconductor device 100 includes a gate runner that connects the gate pad 111 and the gate trench portion. In FIG. 1, the gate runner is hatched with diagonal lines.

The gate runner of the present example includes an outer circumferential gate runner 140 and an active-side gate runner 141. The outer circumferential gate runner 140 is arranged between the emitter electrode 52 and the edge side 102 of the semiconductor substrate 10 in the top plan view. The outer circumferential gate runner 140 of the present example surrounds the active portion 120 in the top plan view. Further, the outer circumferential gate runner 140 is connected to the gate pad 111. The outer circumferential gate runner 140 is arranged above the semiconductor substrate 10. The outer circumferential gate runner 140 may be a metal runner.

The active-side gate runner 141 is arranged to be sandwiched between two partial electrodes in the top plan view. In other words, the active-side gate runner 141 is provided in the active portion 120. By providing the active-side gate runner 141 in the active portion 120, a variation in runner length from the gate pad 111 can be reduced for each region of the semiconductor substrate 10.

The active-side gate runner 141 is connected to the gate trench portion of the active portion 120. The active-side gate runner 141 is arranged above the semiconductor substrate 10. The active-side gate runner 141 may be a runner formed of a semiconductor such as polysilicon doped with an impurity.

The active-side gate runner 141 may be connected to the outer circumferential gate runner 140. The active-side gate runner 141 of the present example is provided extending from the outer circumferential gate runner 140 into the active portion 120 in the X axis direction. The active-side gate runner 141 of the present example is provided between the partial electrodes 52-1 and 52-2, and between the partial electrodes 52-1 and 52-3. The active-side gate runner 141 may be provided traversing the active portion 120. In the example of FIG. 1, the temperature sensing unit 117 as described below divides the active-side gate runner 141. In other words, the active-side gate runner 141 is arranged to sandwich the temperature sensing unit 117.

A potential for screening is applied to the screening pad 112 at the time of inspection of the semiconductor device 100. The screening pad 112 is electrically connected to a conductive portion of the dummy trench portion of the active portion 120. The dummy trench portion includes a conductive portion and a dielectric film. The dielectric film is provided between the conductive portion and the semiconductor substrate 10. At the time of inspection of the semiconductor device 100, the emitter potential is applied to the semiconductor substrate 10, and the potential for screening is applied to the conductive portion of the dummy trench portion. The emitter potential may be applied to the semiconductor substrate 10 from the emitter electrode 52. Thus, the quality of the dielectric film can be inspected by applying a predetermined voltage to the dielectric film of the dummy trench portion. When the semiconductor device 100 is mounted, the screening pad 112 is electrically connected to the emitter electrode 52. Thus, the emitter potential is applied to the dummy trench portion.

The semiconductor device 100 includes a dummy runner. The dummy runner connects the screening pad 112 and the dummy trench portion. The dummy runner of the present example has an outer circumferential dummy runner 130 and an active-side dummy runner 131. The outer circumferential dummy runner 130 is arranged between the emitter electrode 52 and the edge side 102 of the semiconductor substrate 10 in the top plan view. The outer circumferential dummy runner 130 of the present example surrounds the active portion 120 in the top plan view. The outer circumferential dummy runner 130 may be arranged between the active portion 120 and the outer circumferential gate runner 140. The outer circumferential dummy runner 130 may be arranged between the outer circumferential gate runner 140 and the edge side 102 of the semiconductor substrate 10. The outer circumferential dummy runner 130 is connected to the screening pad 112. The outer circumferential dummy runner 130 is arranged above the semiconductor substrate 10. The outer circumferential dummy runner 130 may be a metal runner.

The active-side dummy runner 131 is arranged to be sandwiched between two partial electrodes in the top plan view. In other words, the active-side dummy runner 131 is provided in the active portion 120. By providing the active-side dummy runner 131 in the active portion 120, a variation in runner length from the screening pad 112 can be reduced for each region of the semiconductor substrate 10.

The active-side dummy runner 131 is connected to the dummy trench portion of the active portion 120. The active-side dummy runner 131 is arranged above the semiconductor substrate 10. The active-side dummy runner 131 may be a metal runner.

The active-side dummy runner 131 may be connected to the outer circumferential dummy runner 130. The active-side dummy runner 131 of the present example is provided extending from the outer circumferential dummy runner 130 into the active portion 120 in the X axis direction. The active-side dummy runner 131 of the present example is provided between the partial electrodes 52-1 and 52-2, and between the partial electrodes 52-1 and 52-3. The active-side dummy runner 131 may be provided traversing the active portion 120. In the example of FIG. 1, the temperature sensing unit 117 as described below divides the active-side dummy runner 131. In other words, the active-side dummy runner 131 is arranged to sandwich the temperature sensing unit 117.

The entirety of one of the active-side gate runner 141 and the active-side dummy runner 131 in the first direction is covered by the other of the active-side gate runner 141 and the active-side dummy runner 131. The first direction of the present example is the Y axis direction. In the present example, the entirety of the active-side gate runner 141 in the Y axis direction is covered by the active-side dummy runner 131. In other words, both ends of the active-side gate runner 141 in the Y axis direction are arranged in a region sandwiched by both ends of the active-side dummy runner 131 in the Y axis direction. The active-side gate runner 141 may have a region that is not covered by the active-side dummy runner 131 at any location in the X axis direction. In the example of FIG. 1, a portion 150 of the active-side gate runner 141 that is in contact with the outer circumferential gate runner 140 is not covered by any of the active-side dummy runner 131 and the outer circumferential dummy runner 130. In the active-side gate runner 141, a length of the portion that is covered by the active-side dummy runner 131 and the outer circumferential dummy runner 130 in the X axis direction may be five or more times larger than or may be ten or more times larger than a length of the portion 150 that is not covered by the active-side dummy runner 131 and the outer circumferential dummy runner 130 in the X axis direction. The length of the portion 150 in the X axis direction corresponds to an interval between the outer circumferential gate runner 140 and the outer circumferential dummy runner 130.

By providing the active-side gate runner 141 and the active-side dummy runner 131 overlapping with each other, the area occupied by the active-side gate runner 141 and the active-side dummy runner 131 can be reduced. Thus, an area for a device such as a transistor can be reserved in the active portion 120. One of the active-side gate runner 141 and the active-side dummy runner 131 may be a metal runner and the other may be a semiconductor runner. Thus, it becomes easier to make the two runners overlap with each other. The metal runner may be arranged in a higher position than the semiconductor runner. An interlayer dielectric film is provided between the two runners.

In the present example, the active-side dummy runner 131 is the metal runner, and the active-side gate runner 141 is the semiconductor runner. In another example, the active-side dummy runner 131 may be the semiconductor runner, and the active-side gate runner 141 may be the metal runner. In this case, the outer circumferential dummy runner 130 may be arranged between the outer circumferential gate runner 140 and the edge side 102 of the semiconductor substrate 10.

The temperature sensing unit 117 is a PN junction diode formed of polysilicon or the like. The temperature sensing unit 117 is arranged above the semiconductor substrate 10. The temperature sensing unit 117 may be arranged between the partial electrodes 52-1, 52-2, and 52-3, i.e. generally at a center of the active portion 120. An interlayer dielectric film is provided between the temperature sensing unit 117 and the semiconductor substrate 10. The anode pad 113 and the cathode pad 114 are connected to an anode region and a cathode region of the temperature sensing unit 117 via runners 118 and 119.

The semiconductor device 100 of the present example includes an edge termination structure portion 90 between the outer circumferential gate runner 140 and the edge side 102. The edge termination structure portion 90 alleviates an electric field concentration on the upper surface side of the semiconductor substrate 10. The edge termination structure portion 90 has a structure of at least one of a guard ring, a field plate and a RESURF, or a structure obtained by combining of a plurality of structures thereof, which are provided annularly surrounding the active portion 120, for example.

The screening pad 112 and the gate pad 111 of the present example are arranged in the vicinity of a common edge side 102. The vicinity of the edge side 102 refers to a region between the edge side 102 and the emitter electrode 52. Further, the anode pad 113 and the cathode pad 114 may be arranged in the vicinity of an edge side 102 on the opposite side to the gate pad 111.

Figure 2:
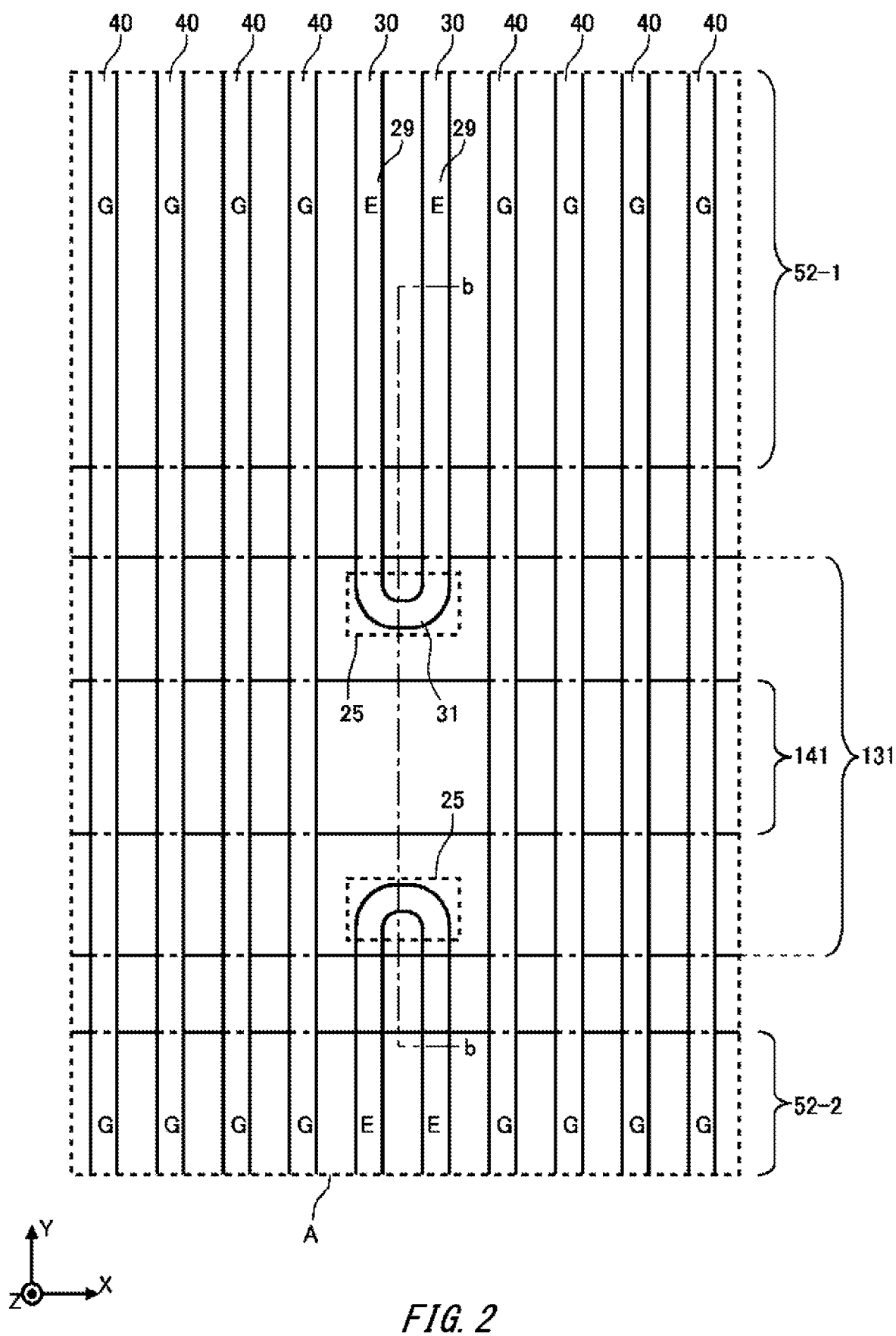
FIG. 2 is an enlarged view of a region A in FIG. 1.

FIG. 2 is an enlarged view of a region A in FIG. 1. In FIG. 2, the partial electrodes 52-1 and 52-2, the active-side gate runner 141, the active-side dummy runner 131, the connecting portions 25, the gate trench portions 40, and the dummy trench portions 30 are shown, while other members are omitted. In FIG. 2, each of the gate trench portions 40 is indicated by a symbol G, and each of the dummy trench portions 30 is indicated by a symbol E.

Each of the gate trench portions 40 and the dummy trench portions 30 has a longitudinal length in the Y axis direction in the top plan view. In other words, each of the gate trench portions 40 and the dummy trench portions 30 is provided extending in the Y axis direction. Each of the gate trench portions 40 and the dummy trench portions 30 may have a linear portion that is parallel to the Y axis direction.

Each trench portion of the gate trench portions 40 and the dummy trench portions 30 is arranged with a predetermined interval in the X axis direction. Note that the array pattern of the gate trench portions 40 and the dummy trench portions 30 is not limited to the one shown in the example of FIG. 2. A group including one or more gate trench portions 40 and a group including one or more dummy trench portions 30 may be arranged alternately along the X axis direction. In the present specification, the region of the semiconductor substrate 10 sandwiched between two trench portions in the X axis direction may be referred to as a mesa portion.

At least one trench portion may have tips of two linear portions connected to each other via a curved tip portion. In the example of FIG. 2, each of the dummy trench portions 30 has two linear portions 29 and one tip portion 31.

Each of the gate trench portions 40 is connected to the active-side gate runner 141. The gate trench portion 40 may have a region that overlaps with the active-side gate runner 141 in the top plan view. The gate trench portion 40 may be connected to the active-side gate runner 141 at the region that overlaps with the active-side gate runner 141. The gate trench portion 40 of the present example is provided extending from the location where the gate trench portion 40 overlaps with the partial electrode 52-1 to the location where the gate trench portion 40 overlaps with the partial electrode 52-2 in the Y axis direction, and intersects with the active-side gate runner 141 and the active-side dummy runner 131 that extend in the X axis direction. In other words, the gate trench portion 40 traverses the active-side gate runner 141 and the active-side dummy runner 131 in the Y axis direction.

Each of the dummy trench portions 30 is connected to the active-side dummy runner 131. The dummy trench portion 30 may have a region that overlaps with the active-side dummy runner 131 in the top plan view. The dummy trench portion 30 may be connected to the active-side dummy runner 131 at a region that does not overlap with the active-side gate runner 141 and overlaps with the active-side dummy runner 131 in the top plan view. An end of the dummy trench portion 30 in the Y axis direction may be arranged at a region that does not overlap with the active-side gate runner 141 and overlaps with the active-side dummy runner 131 in the top plan view. In the present example, the tip portion 31 of the dummy trench portion 30 is arranged in this region.

The dummy trench portion 30 may be arranged so as not to overlap with the active-side gate runner 141. In the present example, the active-side gate runner 141 is arranged between the dummy trench portions 30 that overlap with the partial electrode 52-1 and the dummy trench portions 30 that overlap with the partial electrode 52-2. In other words, the active-side gate runner 141 is provided to divide the dummy trench portions 30 extending in the Y axis direction.

The semiconductor device 100 may include a connecting portion 25. The connecting portion 25 is formed of polysilicon doped with an impurity, or the like. The connecting portion 25 connects the conductive portion of the dummy trench portion 30 and the active-side dummy runner 131. The connecting portion 25 has a larger width in the X axis direction than that of the dummy trench portion 30. By providing the connecting portion 25, the dummy trench portion 30 and the active-side dummy runner 131 can be easily connected.

Figure 3:
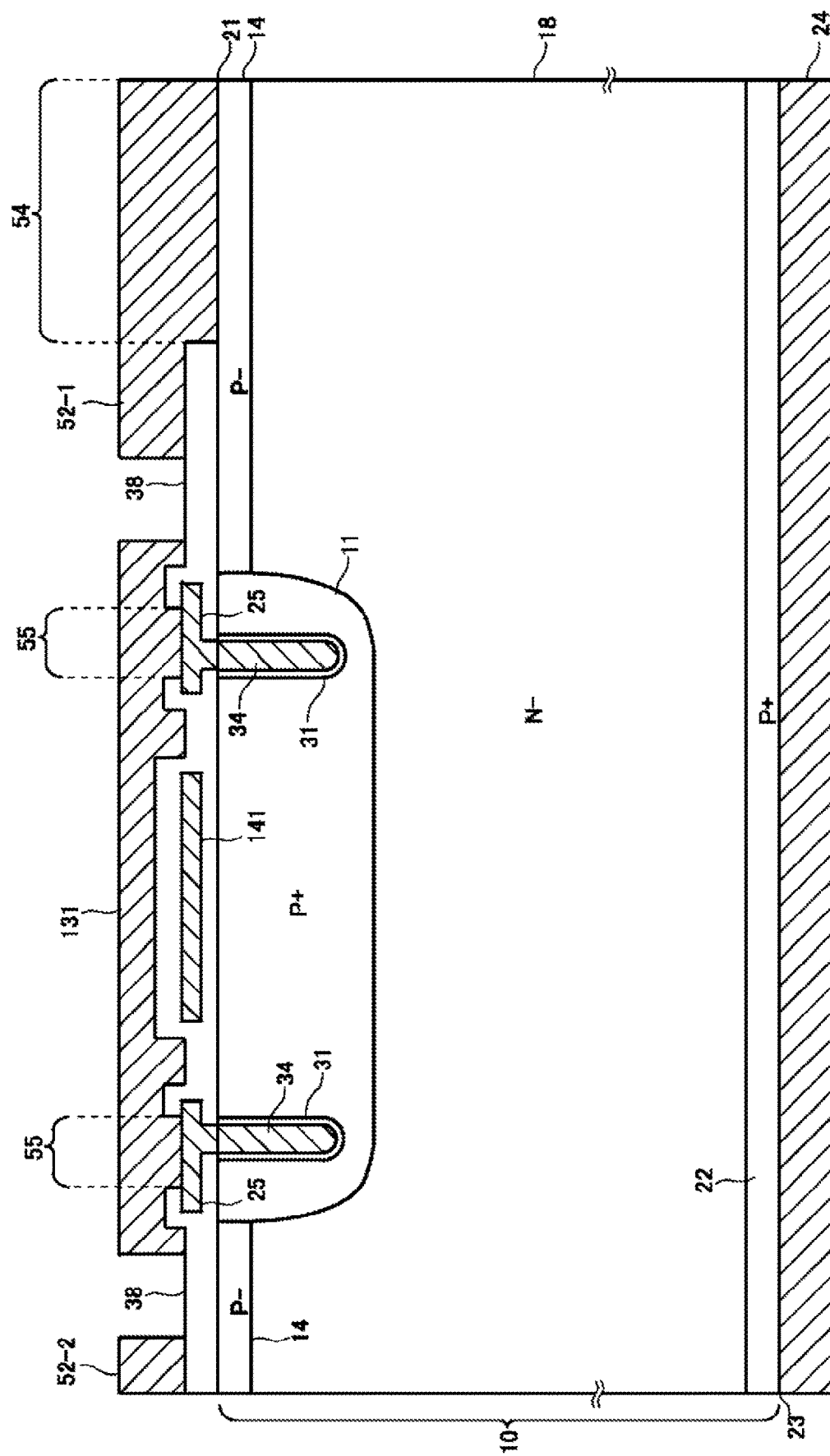
FIG. 3 is a view showing an example of a cross-section b-b in FIG. 2.

FIG. 3 is a view showing an example of a cross-section b-b in FIG. 2. The cross-section b-b is a YZ cross-section through the partial electrodes 52-1, 52-2, the active-side gate runner 141, and the active-side dummy runner 131. In this cross-section, the semiconductor device 100 includes the semiconductor substrate 10, an interlayer dielectric film 38, the partial electrodes 52-1, 52-2, and a collector electrode 24.

The interlayer dielectric film 38 is provided covering an upper surface 21 of the semiconductor substrate 10. The interlayer dielectric film 38 may be a thermally oxidized film, may be a glass such as a BPSG, or may be another dielectric film. Moreover, the interlayer dielectric film 38 may be a film obtained by stacking a plurality of dielectric films.

The partial electrodes 52-1, 52-2, 52-3 of the emitter electrode 52, and the active-side dummy runner 131 are provided on the upper surface of the interlayer dielectric film 38. The collector electrode 24 is provided on a lower surface 23 of the semiconductor substrate 10. The collector electrode 24, the emitter electrode 52, and the active-side dummy runner 131 are provided by a metal material such as aluminum. In the present specification, the direction in which the emitter electrode 52 is connected to the collector electrode 24 (i.e. the Z axis direction) is referred to as a depth direction.

The emitter electrode 52 is in contact with the upper surface 21 of the semiconductor substrate 10 through the contact hole 54 provided in the interlayer dielectric film 38. The emitter electrode 52 may be in contact with the P− type base region 14 provided on the upper surface 21 of the semiconductor substrate 10. The base region 14 functions as an anode region of the diode portion, for example. Further, the base region 14 functions as a channel region of the transistor portion, for example.

The active-side dummy runner 131 is arranged between the partial electrode 52-1 and the partial electrode 52-2 in the Y axis direction. The active-side dummy runner 131 is connected to the connecting portions 25 via contact holes 55 provided in the interlayer dielectric film 38. Each of the connecting portions 25 connects the active-side dummy runner 131 and the dummy conductive portions 34 of the dummy trench portions 30 (in the present example, the tip portions 31).

The active-side gate runner 141 is arranged between the partial electrode 52-1 and the partial electrode 52-2 in the Y axis direction. The entirety of the active-side gate runner 141 in the Y axis direction is covered by the active-side dummy runner 131 arranged above the active-side gate runner 141. The active-side gate runner 141 and the active-side dummy runner 131 are insulated from each other by the interlayer dielectric film 38. Further, the active-side gate runner 141 and the semiconductor substrate 10 are insulated from each other by the interlayer dielectric film 38. Note that the active-side gate runner 141 is connected to the gate trench portion 40 by a contact hole provided in the interlayer dielectric film 38 in a cross-section different from the cross-section shown in FIG. 3.

The tip portions 31 of the dummy trench portions 30 may be covered by a P+ type well region 11. The well region 11 is a region that has a higher doping concentration than the base region 14 and is formed in contact with the upper surface 21 of the semiconductor substrate 10, and is formed to extend to a deeper location than the bottom of the base region 14. By arranging the tip portions 31 inside the well region 11, the electric field concentration toward the tip portions 31 can be alleviated.

The well region 11 may be provided in a wider range than the active-side gate runner 141 in the Y axis direction. The well region 11 may be provided continuously from one of the tip portion 31 to the other of the tip portion 31 that are arranged sandwiching the active-side gate runner 141 in the Y axis direction.

The active-side dummy runner 131 may be provided in a range overlapping with the well region 11 in the Y axis direction, and may be provided in a wider range than the well region 11. Note that the active-side dummy runner 131 is provided in a range that does not overlap with the contact hole 54.

According to the present example, the entirety of the active-side gate runner 141 is arranged to overlap with the active-side dummy runner 131. Thus, the area occupied by the active-side gate runner 141 and the active-side dummy runner 131 in the active portion 120 can be reduced. Thus, an area for a device region such as a transistor can be reserved in the active portion 120.

A P+ type collector region 22 is provided on a lower surface 23 of the semiconductor substrate 10. The collector region 22 functions as a collector of an IGBT (Insulated Gate Bipolar Transistor). An N− type drift region 18 is provided above the collector region 22. On the lower surface 23 of the semiconductor substrate 10, an N+ type cathode region that functions as a cathode of the diode may be provided and an N+ type drain region that functions as a drain of an MOS transistor may be provided.

Figure 4:
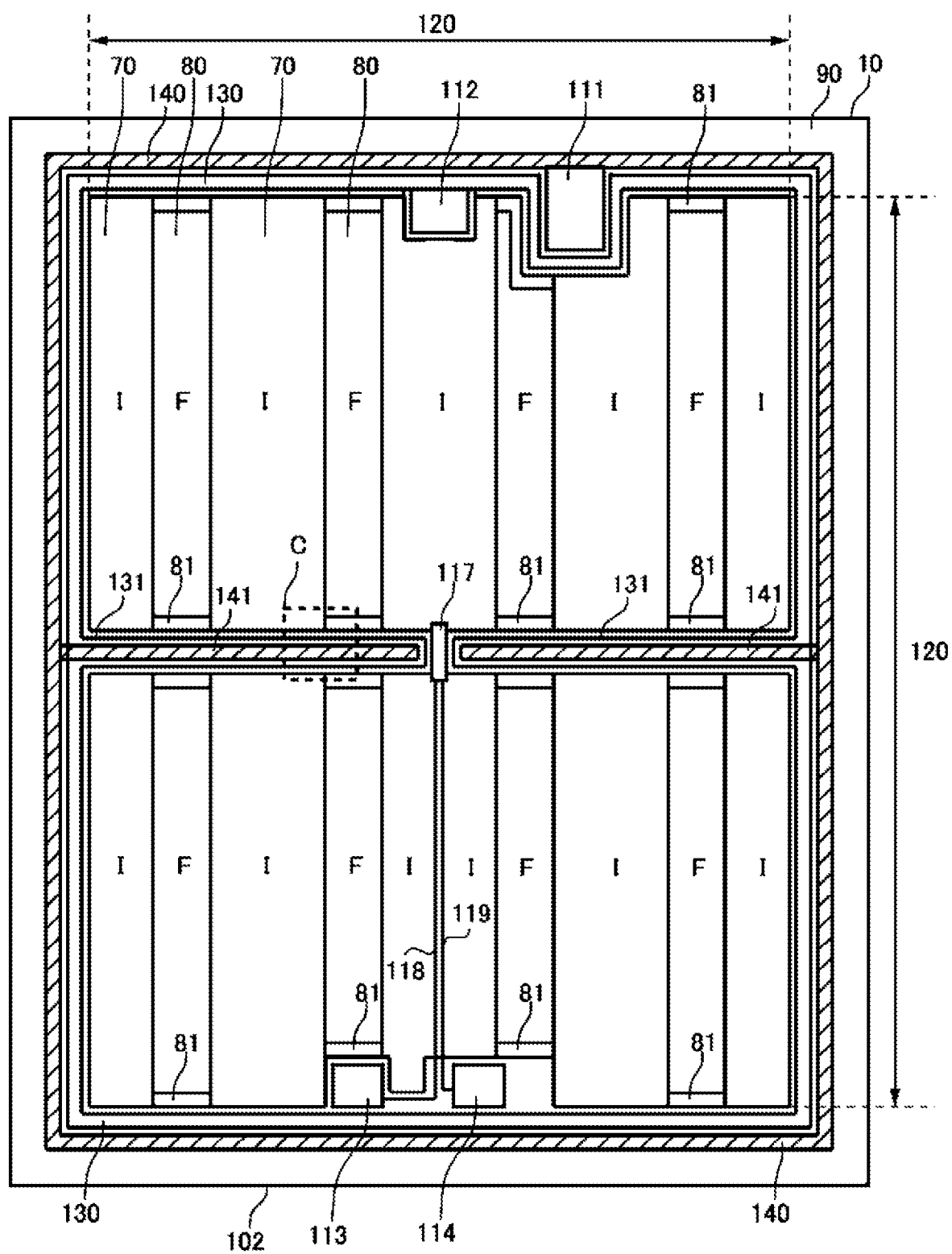
FIG. 4 is a view showing an exemplary device arrangement in an active portion 120.

FIG. 4 is a view showing an exemplary device arrangement in the active portion 120. The active portion 120 of the present example is provided with transistor portions 70 including a transistor device such as an IGBT, and diode portions 80 including a diode device such as an FWD (freewheeling diode).

In FIG. 4, a region where each of the transistor portions 70 is arranged is indicated by a symbol "T", and a region where each of the diode portions 80 is arranged is indicated by a symbol "F". The transistor portions 70 and the diode portions 80 are arranged side by side along a predetermined array direction (the X axis direction in FIG. 4). The transistor portions 70 and the diode portions 80 may be arranged alternately side by side in the X axis direction. In the present specification, a direction perpendicular to the array direction in the top plan view may be referred to as an extension direction (the Y axis direction in FIG. 1). Each of the transistor portions 70 and the diode portions 80 may have a longitudinal length in the extension direction. In other words, the length of each of the transistor portions 70 in the Y axis direction is larger than the width in the X axis direction. Similarly, the length of each of the diode portions 80 in the Y axis direction is larger than the width in the X axis direction. The extension directions of the transistor portions 70 and the diode portions 80 may be the same as a longitudinal direction of the trench portions.

Each of the diode portions 80 includes an N+ type cathode region in a region in contact with the lower surface of the semiconductor substrate 10. In the present specification, a region where the cathode region is provided is referred to as the diode portion 80. In other words, the diode portion 80 is a region that overlaps with the cathode region in the top plan view. On the lower surface of the semiconductor substrate 10, a collector region 22 may be provided in a region other than the cathode region. In the present specification, the diode portion 80 may also include an extension region 81 where the diode portion 80 extends to a gate runner or a dummy runner in the Y axis direction. The collector region 22 is provided on a lower surface of the extension region 81.

Figure 5:
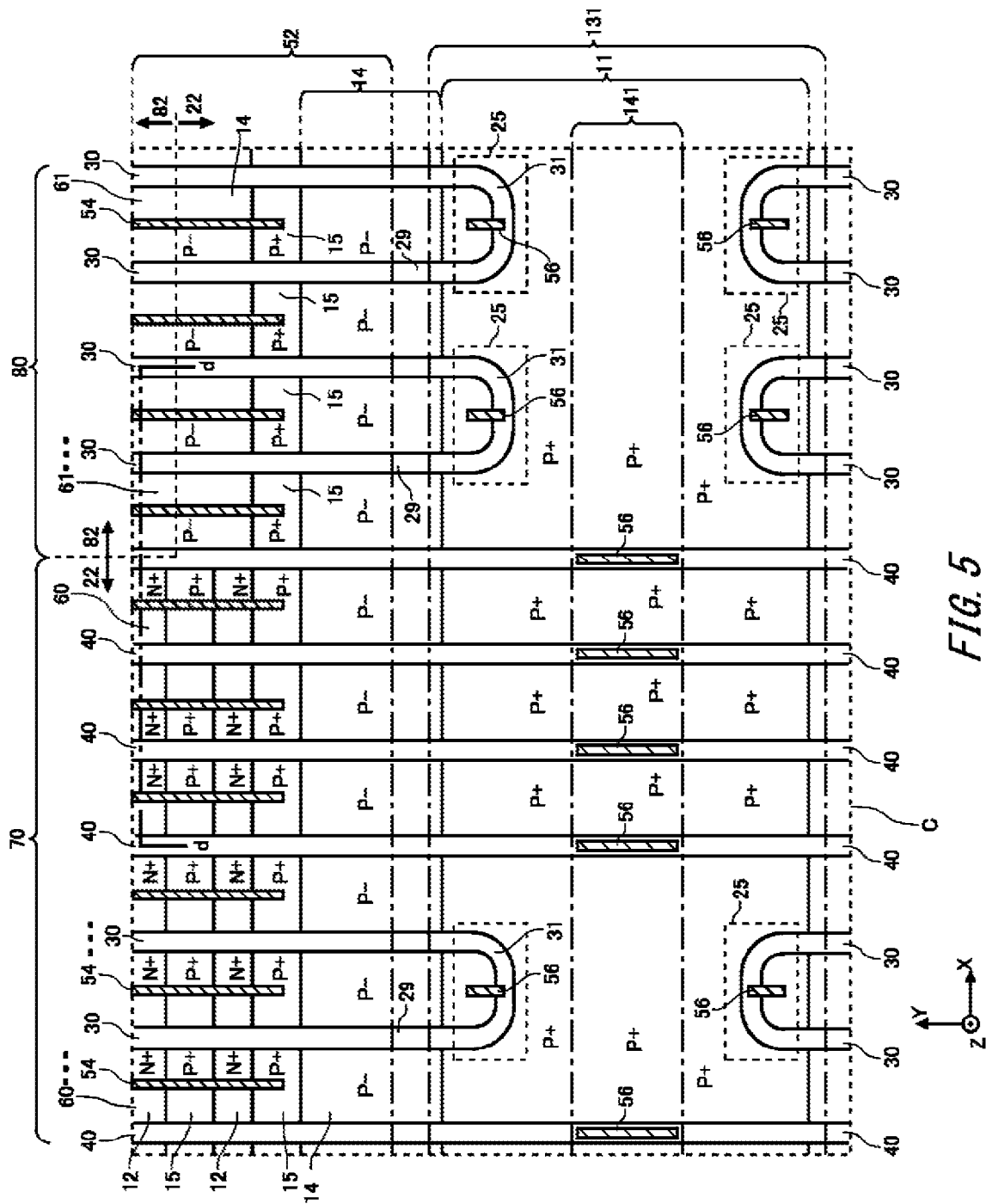
FIG. 5 is an enlarged view of a region C in FIG. 4.

FIG. 5 is an enlarged view of a region C in FIG. 4. The region C is a region including the transistor portion 70, the diode portion 80, the active-side gate runner 141, and the active-side dummy runner 131. The semiconductor substrate 10 of the present example is provided with the gate trench portions 40 that are in contact with the upper surface of the semiconductor substrate 10, the dummy trench portions 30, the well region 11, the emitter regions 12, the base regions 14, and the contact regions 15. Further, the semiconductor substrate 10 of the present example is provided with the cathode region 82 and the collector region 22 that are in contact with the lower surface of the semiconductor substrate 10.

Further, the emitter electrode 52, the active-side dummy runner 131, and the active-side gate runner 141 are provided above the semiconductor substrate 10. An interlayer dielectric film is provided between the emitter electrode 52 and the upper surface of the semiconductor substrate 10, but it is omitted in FIG. 5. In the interlayer dielectric film of the present example, contact holes 56 and contact holes 54 are provided penetrating this interlayer dielectric film.

The emitter electrode 52 is in contact with the emitter regions 12, the contact regions 15 and the base regions 14 on the upper surface of the semiconductor substrate 10 through the contact holes 54. Further, the active-side dummy runner 131 is connected to the dummy conductive portions in the dummy trench portions 30 through the contact holes 56. The connecting portions 25 may be provided between the active-side dummy runner 131 and the dummy conductive portions.

A dielectric film such as a thermally oxidized film is provided between the active-side gate runner 141 and the semiconductor substrate 10. The active-side gate runner 141 is connected to the gate conductive portions in the gate trench portions 40 on the upper surface of the semiconductor substrate 10. The active-side gate runner 141 is not connected to the dummy conductive portions in the dummy trench portions 30. The active-side gate runner 141 is connected to the gate conductive portions in the gate trench portions 40 through the contact holes 56 provided in the dielectric film. The gate trench portions 40, the dummy trench portions 30, the active-side gate runner 141, and the active-side dummy runner 131 have similar arrangements and configurations to those of the example shown in FIG. 2.

The transistor portion 70 is provided with the gate trench portions 40. The diode portion 80 is provided with the dummy trench portions 30. The transistor portion 70 may also be provided with the dummy trench portions 30.

In the semiconductor substrate 10, the region sandwiched between each trench portion is referred to as a mesa portion. The transistor portion 70 is provided with mesa portions 60, and the diode portion 80 is provided with mesa portions 61. The mesa portion is a region that is closer to the upper surface side than the deepest bottom of each of the trench portions, in the portion of the semiconductor substrate 10 sandwiched between the trench portions.

A P− type base region 14 is provided in each mesa portion. The base region 14 is exposed to a part of an upper surface of the mesa portion. A contact region 15 and an emitter region 12 are provided on an upper surface of the base region 14 of the transistor portion 70. The contact region 15 of the present example is of the P+ type having a higher doping concentration than the base region 14. The emitter region 12 of the present example is of the N+ type having a higher doping concentration than the drift region 18 shown in FIG. 3.

The emitter region 12 is provided in contact with the gate trench portion 40 at the upper surface of the semiconductor substrate 10. The emitter region 12 and the contact region 15 of the present example are provided from one of the trench portions to the other of the trench portions that sandwich the mesa portion 60. The contact region 15 and the emitter region 12 are arranged alternately along the Y axis direction on the upper surface of the mesa portion 60 of the present example. Among the contact regions 15 provided in the mesa portions 60, the endmost contact region 15 in the Y axis direction may be provided in a location overlapping with the end of the contact hole 54 in the Y axis direction. In the Y axis direction, the emitter region 12 is arranged in a range where the contact hole 54 is provided.

In the mesa portion 60 of another example, the contact region 15 and the emitter region 12 may be provided in a stripe-shaped arrangement along the Y axis direction. For example, one emitter region 12 is provided in contact with one of two trench portions sandwiching the mesa portion 60, while another emitter region 12 is provided in contact with the other of the two trench portions. The contact region 15 is provided in a region sandwiched between the one emitter region 12 and the another emitter region 12. The base region 14 sandwiching the region where the contact region 15 and the emitter region 12 are provided in the Y axis direction may be arranged on the upper surface of the mesa portion 60.

The mesa portion 61 in the diode portion 80 may not be provided with the emitter region 12. The base region 14 is provided on the upper surface of the mesa portion 61 of the present example. The base region 14 may occupy an area of half or more of the upper surface of the mesa portion 61. The contact region 15 may be arranged on the upper surface of the mesa portion 61. The contact region 15 of the mesa portion 61 may be provided in a location overlapping with the end of the contact hole 54 in the Y axis direction. The base regions 14 sandwiching the contact region 15 in the Y axis direction may be provided on the upper surface of the mesa portion 61.

The contact holes 54 provided in the transistor portion 70 and the contact holes 54 provided in the diode portion 80 may have the same or different length in the Y axis direction. In the transistor portion 70, each of the contact holes 54 is provided above each region of the contact regions 15 and the emitter regions 12. The contact hole 54 of the present example is not provided in a region corresponding to the base region 14 of the mesa portion 60 and the well region 11. In the diode portion 80, each of the contact holes 54 is provided above each of the contact regions 15 and the base regions 14. Note that the contact hole 54 is not provided above the base region 14 sandwiched between the contact region 15 and the well region 11 in the mesa portion 61.

In the diode portion 80, an N+ type cathode region 82 is provided in a region in contact with the lower surface of the semiconductor substrate 10. Within the region in contact with the lower surface of the semiconductor substrate 10, a collector region 22 is provided in a region where the cathode region 82 is not provided. The cathode region 82 is arranged distant from the active-side dummy runner 131 in the Y axis direction. At least one of the base region 14 and the contact region 15 may be arranged between the cathode region 82 and the active-side dummy runner 131 in the top plan view. In the present example, the distance between the cathode region 82 and the active-side dummy runner 131 in the Y axis direction is larger than the distance between the contact holes 54 and the active-side dummy runner 131 in the Y axis direction.

Figure 6:
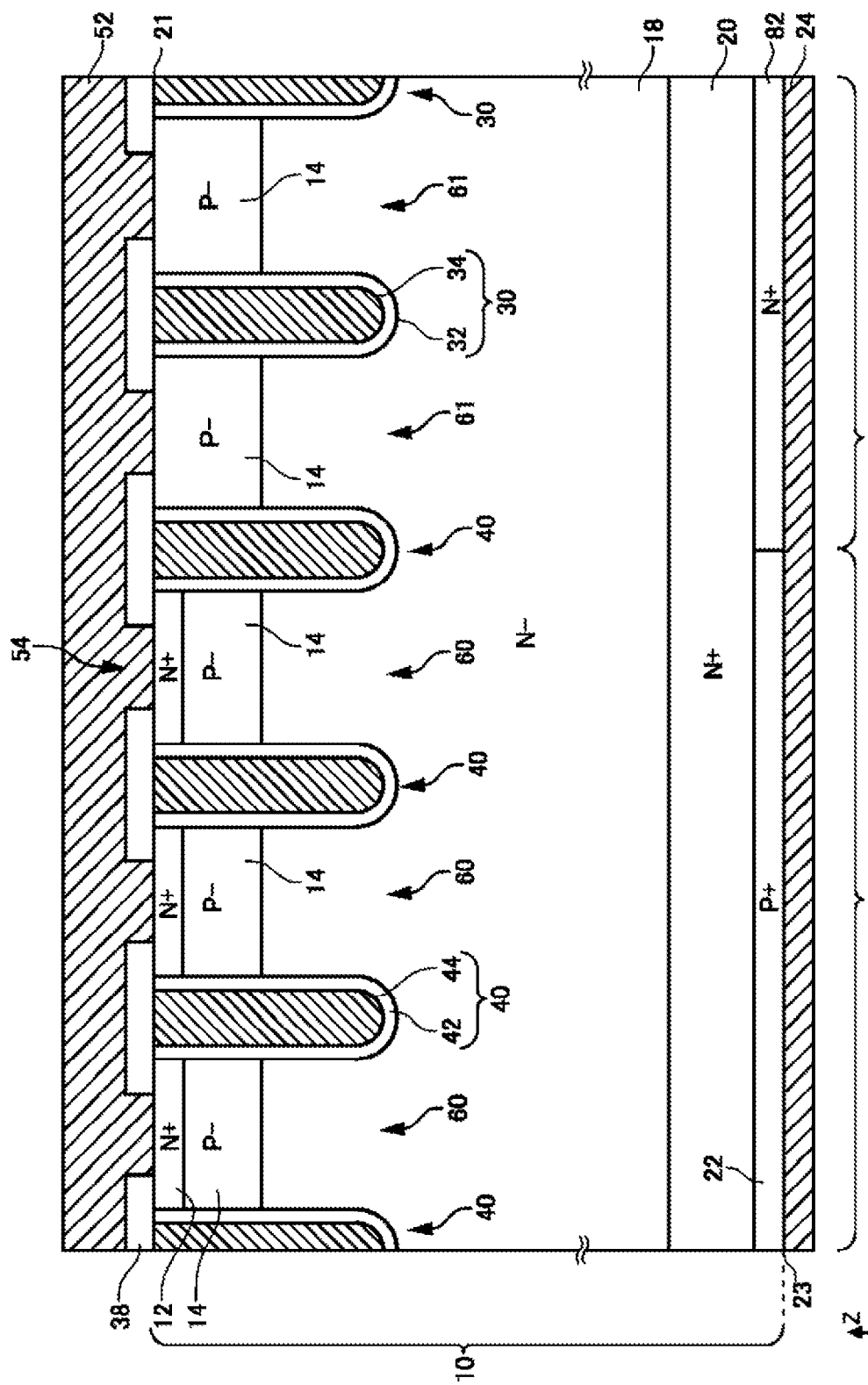
FIG. 6 is a view showing an example of a cross-section d-d in FIG. 5.

FIG. 6 is a view showing an example of a cross-section d-d in FIG. 5. The cross-section d-d is an XZ plane through the emitter region 12. The semiconductor device 100 of the present example includes the semiconductor substrate 10, the interlayer dielectric film 38, the emitter electrode 52, and the collector electrode 24 in this cross-section.

P− type base regions 14 are provided on the upper surface 21 side of the semiconductor substrate 10 in this cross-section. In this cross-section, on the upper surface 21 side of the semiconductor substrate 10 in the transistor portion 70, N+ type emitter regions 12 and P− type base regions 14 are provided in order from the upper surface 21 of the semiconductor substrate 10. An N+ type accumulation region may be provided below the base regions 14. In this cross-section, on the upper surface 21 side of the semiconductor substrate 10 in the diode portion 80, P− type base regions 14 are provided.

In the transistor portion 70 and the diode portion 80, an N− type drift region 18 is provided under the base regions 14. In the transistor portion 70 and the diode portion 80, an N+ type buffer region 20 is provided under the drift region 18.

The buffer region 20 has a higher doping concentration than a doping concentration of the drift region 18. The buffer region 20 may function as a field stop layer which prevents a depletion layer widening from a lower surface of each of the base regions 14 from reaching the collector region 22 and the cathode region 82.

In the transistor portion 70, the P+ type collector region 22 is provided under the buffer region 20. In the diode portion 80, the cathode region 82 is provided under the buffer region 20.

One or more gate trench portions 40 and one or more dummy trench portions 30 are provided on the upper surface 21 side of the semiconductor substrate 10. Each trench portion is provided penetrating each of the base regions 14 from the upper surface 21 of the semiconductor substrate 10 to reach the drift region 18. In a region where at least any of the emitter region 12 and the contact region 15 is provided, each trench portion penetrates these regions to reach the drift region 18 as well. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

Each of the gate trench portions 40 has a gate dielectric film 42 and a gate conductive portion 44 which are provided on the upper surface 21 side of the semiconductor substrate 10. The gate dielectric film 42 is provided covering an inner wall of the gate trench portion 40. The gate dielectric film 42 may be formed by oxidizing or nitriding a semiconductor on the inner wall of the gate trench portion 40. The gate conductive portion 44 is provided on an inner side relative to the gate dielectric film 42 inside the gate trench portion 40. In other words, the gate dielectric film 42 insulates the gate conductive portion 44 from the semiconductor substrate 10. The gate conductive portion 44 is formed of a conductive material such as polysilicon.

The gate conductive portion 44 includes a region opposed to the base region 14 across the gate dielectric film 42. The gate trench portion 40 in this cross-section is covered by the interlayer dielectric film 38 on the upper surface 21 of the semiconductor substrate 10. When a predetermined voltage is applied to the gate conductive portion 44, a channel as an inversion layer of electrons is formed in the interfacial surface layer of the base region 14 in contact with the gate trench.

The dummy trench portions 30 may have the same structure as the gate trench portions 40 in this cross-section. Each of the dummy trench portions 30 includes a dummy trench, a dummy dielectric film 32, and a dummy conductive portion 34 which are provided on the upper surface 21 side of the semiconductor substrate 10. The dummy dielectric film 32 is provided covering an inner wall of the dummy trench. The dummy conductive portion 34 is provided inside the dummy trench, and is provided on an inner side relative to the dummy dielectric film 32. The dummy dielectric film 32 insulates the dummy conductive portion 34 from the semiconductor substrate 10. The dummy conductive portion 34 may be formed of the same material as the gate conductive portion 44.

Figure 7:
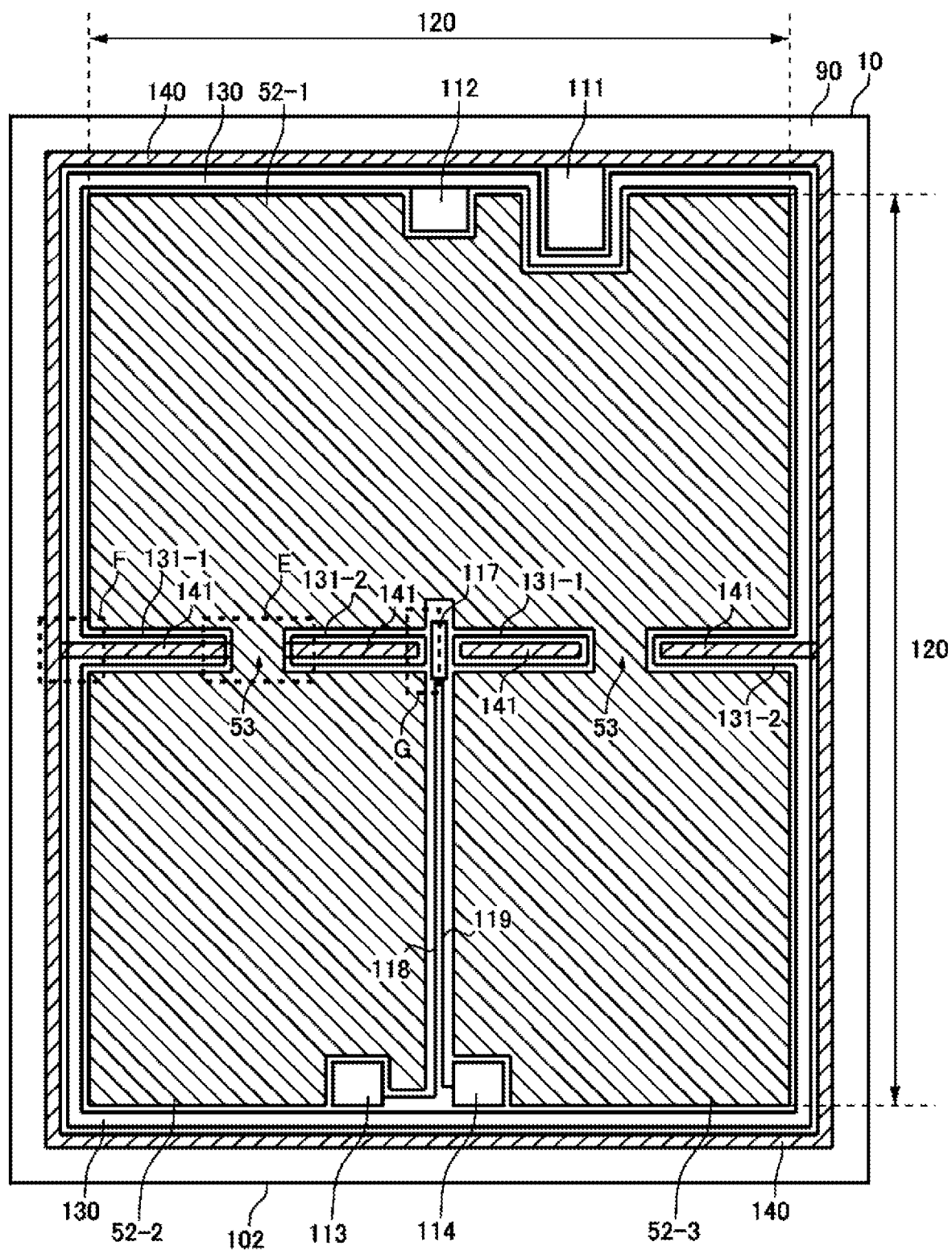
FIG. 7 is a view showing another exemplary structure of an emitter electrode 52.

FIG. 7 is a view showing another exemplary structure of the emitter electrode 52. The emitter electrode 52 of the present example includes bridge portions 53 each connecting two partial electrodes. The emitter electrode 52 of the present example includes a bridge portion 53 connecting a partial electrode 52-1 and a partial electrode 52-2, and a bridge portion 53 connecting the partial electrode 52-1 and a partial electrode 52-3. The bridge portions 53 may be formed of the same material as the partial electrodes.

Each active-side dummy runner 131 is divided into at least two partial runners by each of the bridge portions 53. In the example of FIG. 7, each active-side dummy runner 131 is divided into a partial runner 131-1 and a partial runner 131-2. In other words, the bridge portion 53 is provided between the partial runner 131-1 and the partial runner 131-2.

Figure 8:
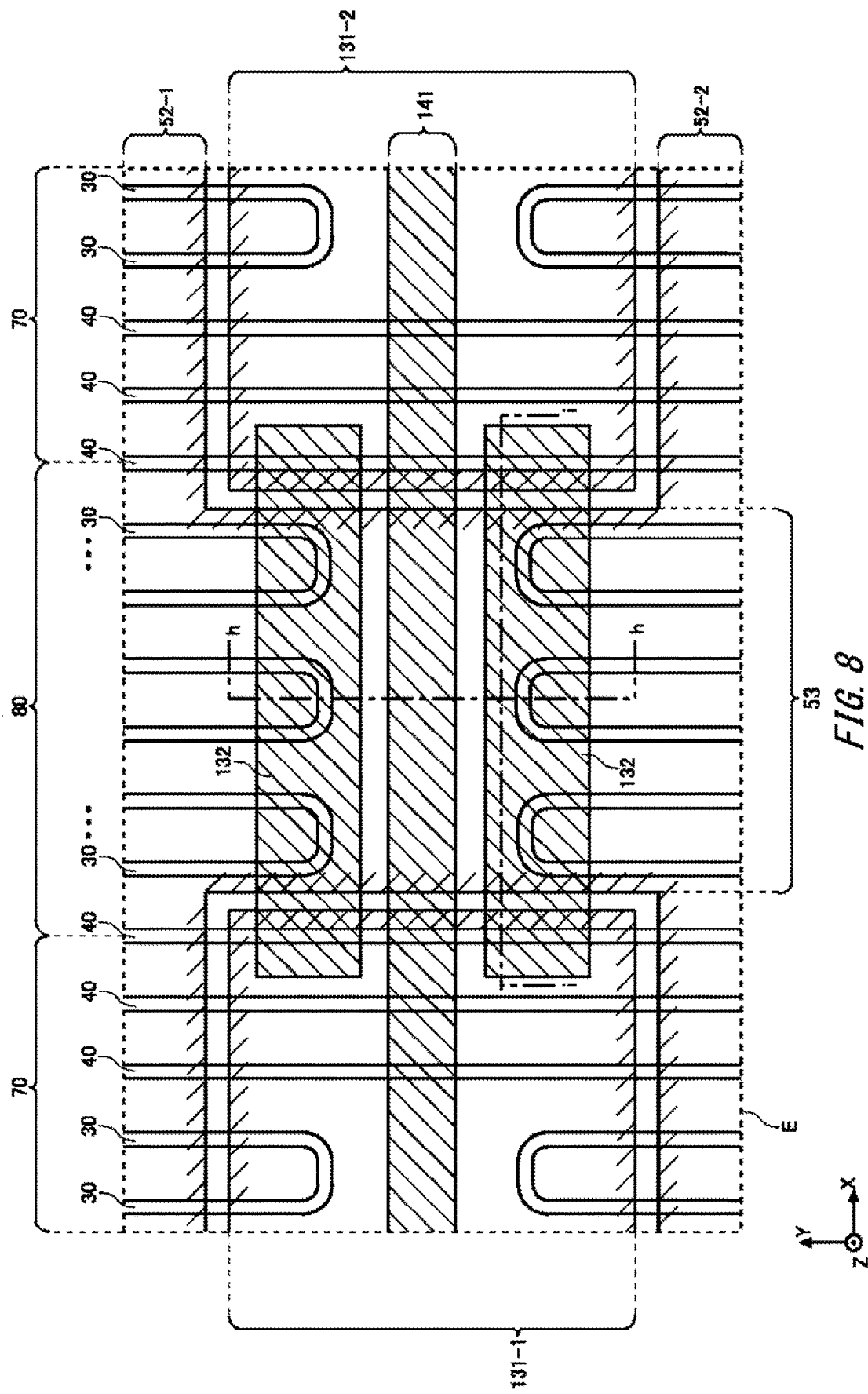
FIG. 8 is an enlarged view in the vicinity of a bridge portion 53.

FIG. 8 is an enlarged view of a region E in FIG. 7. The region E is a region in the vicinity of the bridge portion 53. In FIG. 8, the partial electrodes 52-1, 52-2, the bridge portion 53, the active-side gate runner 141, the active-side dummy runner 131, at least one intersecting dummy runner 132, and each trench portion are shown, while other members are omitted. In FIG. 8, the active-side gate runner 141 and the intersecting dummy runner 132 are hatched with diagonal lines in its entirety. Further, the partial electrodes 52-1, 52-2, the bridge portion 53, and the active-side dummy runner 131 are hatched with diagonal lines only at their ends.

As described above, the active-side dummy runner 131 is divided into a partial runner 131-1 and a partial runner 131-2 by the bridge portion 53. The bridge portion 53 extends through between the partial runner 131-1 and the partial runner 131-2, and connects the partial electrodes 52-1 and 52-2.

The intersecting dummy runner 132 is provided intersecting with the bridge portion 53, and connects the partial runner 131-1 and the partial runner 131-2. The intersecting dummy runner 132 of the present example is provided traversing below the bridge portion 53 from the partial runner 131-1 to the partial runner 131-2 in the X axis direction. The intersecting dummy runner 132 may be a runner made of a semiconductor material such as polysilicon doped with an impurity. The intersecting dummy runner 132 is arranged between the semiconductor substrate 10, and the active-side dummy runner 131 and the bridge portion 53.

The intersecting dummy runner 132 is insulated from the semiconductor substrate 10, the active-side dummy runner 131, and the bridge portion 53 by an interlayer dielectric film. The intersecting dummy runner 132 is connected to the active-side dummy runner 131 via a contact hole provided in the interlayer dielectric film at a location where the intersecting dummy runner 132 overlaps with the active-side dummy runner 131.

By providing the bridge portion 53, a variation of the potential in the emitter electrode 52 can be reduced. Further, by providing the intersecting dummy runner 132, the active-side dummy runner 131 divided by the bridge portion 53 can be connected. Thus, a potential for screening can be conveyed into the active portion 120.

Note that the active-side gate runner 141 is not divided by the bridge portion 53. The active-side gate runner 141 of the present example is provided intersecting with the bridge portion 53. In other words, the active-side gate runner 141 traverses below the bridge portion 53 in the X axis direction. Thus, a gate potential can be conveyed into the active portion 120.

Note that, by making the active-side gate runner 141 of a semiconductor runner, it becomes easier to make the bridge portion 53 and the active-side gate runner 141 intersect with each other. Thus, the gate potential can be conveyed by a single active-side gate runner 141, and an attenuation of the gate potential can be suppressed.

The intersecting dummy runner 132 may be connected to the dummy trench portions 30. Thus, the potential for screening can be applied to the dummy trench portions 30 even in a region where the bridge portion 53 is provided. The intersecting dummy runner 132 may be arranged sandwiching the active-side gate runner 141 in the Y axis direction. Thus, each of the dummy trench portions 30 on the partial electrode 52-1 side and the dummy trench portions 30 on the partial electrode 52-2 side can be easily connected to the intersecting dummy runner 132.

The dummy trench portions 30 may be arranged below the bridge portion 53. The gate trench portions 40 may be arranged below the bridge portion 53. In the present example, the dummy trench portions 30 are arranged, and the gate trench portions 40 are not arranged, below the bridge portion 53.

The bridge portion 53 may be provided in the diode portion 80. In this case, the intersecting dummy runner 132 is connected to the dummy trench portions 30 in the diode portion 80. Each of the dummy trench portions 30 may have a tip portion at a location overlapping with the intersecting dummy runner 132.

The dummy trench portions 30 of the transistor portion 70 are connected to the active-side dummy runner 131 (in the present example, the partial runner 131-1 and the partial runner 131-2). According to such configuration as above, each dummy trench portion 30 can be easily connected to the dummy runner. Further, because the active-side gate runner 141 is not divided, each gate trench portion 40 can be easily connected to the active-side gate runner 141.

Figure 9:
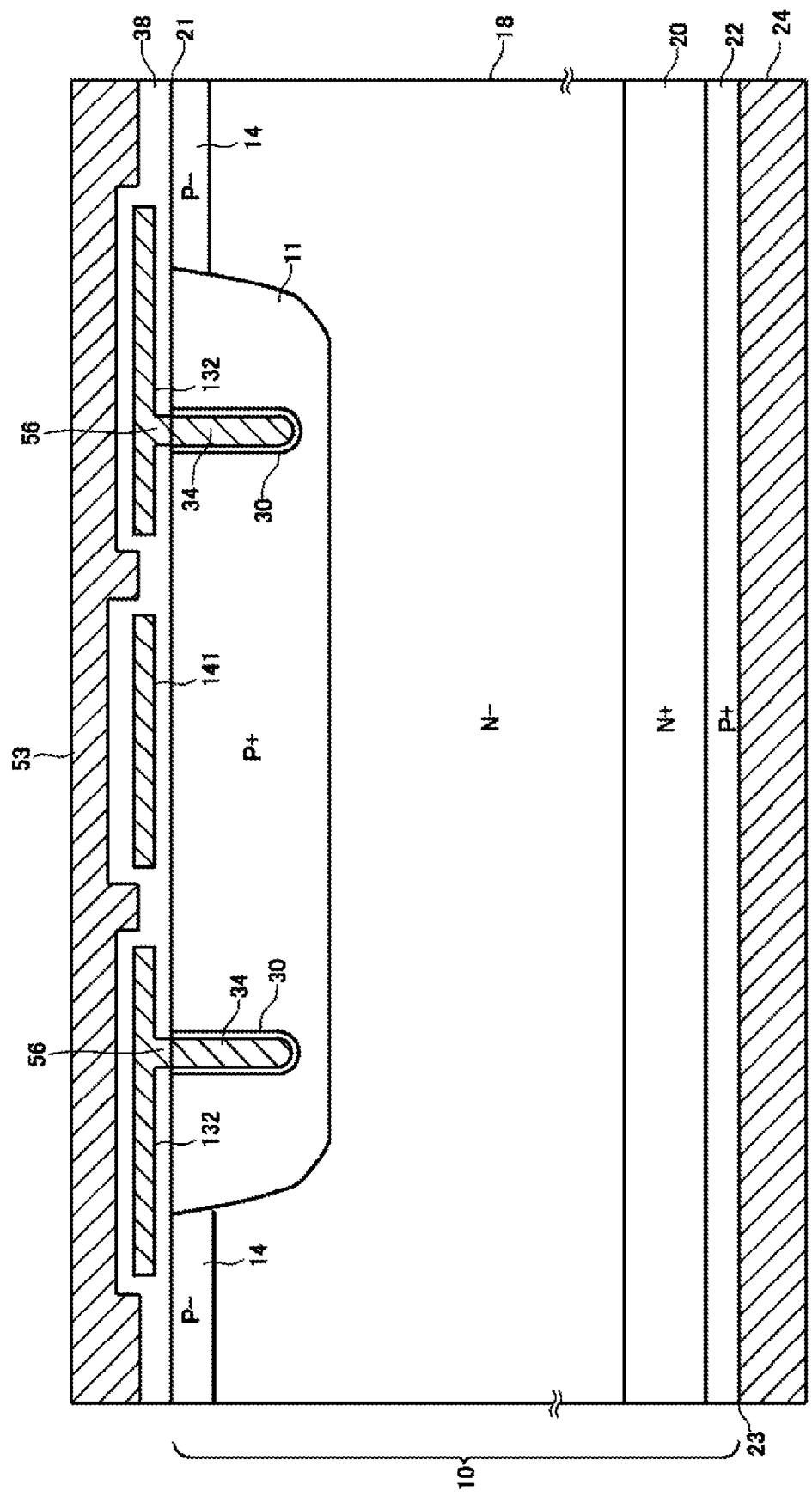
FIG. 9 is a view showing an example of a cross-section h-h in FIG. 8.

FIG. 9 is a view showing an example of a cross-section h-h in FIG. 8. The cross-section h-h is a YZ cross-section through two intersecting dummy runners 132 and an active-side gate runner 141. The two intersecting dummy runners 132 and the active-side gate runner 141 are provided between a bridge portion 53 and a semiconductor substrate 10. The two intersecting dummy runners 132 and the active-side gate runner 141 may be provided at the same level. The two intersecting dummy runners 132 and the active-side gate runner 141 are insulated from the bridge portion 53 by an interlayer dielectric film 38. Further, the two intersecting dummy runners 132 and the active-side gate runner 141 are also insulated from the semiconductor substrate 10 by the interlayer dielectric film 38. Note that each of the intersecting dummy runners 132 is connected to a dummy conductive portion 34 in the dummy trench portion 30 through the contact hole 56 provided in the interlayer dielectric film 38.

Figure 10:
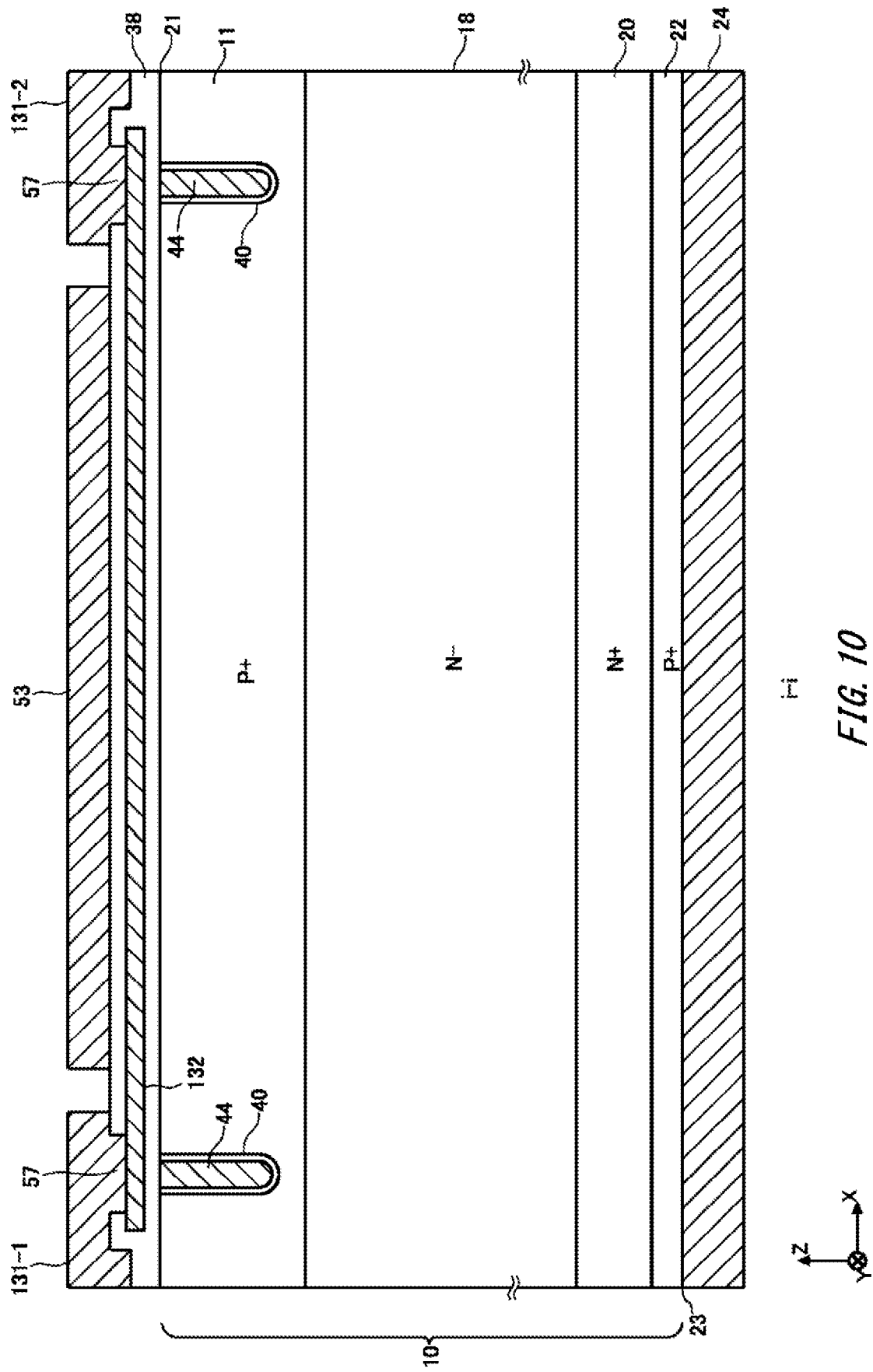
FIG. 10 is a view showing an example of a cross-section i-i in FIG. 8.

FIG. 10 is a view showing an example of a cross-section i-i in FIG. 8. The cross-section i-i is an XZ cross-section including a partial runner 131-1, a partial runner 131-2, and a bridge portion 53. The partial runner 131-1, the partial runner 131-2, and the bridge portion 53 are arranged on the interlayer dielectric film 38. The partial runner 131-1, 131-2, and the bridge portion 53 may be provided at the same level.

The intersecting dummy runner 132 is provided between the partial runner 131-1, the partial runner 131-2 and the bridge portion 53, and the semiconductor substrate 10. The intersecting dummy runner 132 is insulated from the partial runner 131-1, the partial runner 131-2, and the bridge portion 53 by the interlayer dielectric film 38. Note that the intersecting dummy runner 132 is connected to the partial runner 131-1 and the partial runner 131-2 by contact holes 57 provided in the interlayer dielectric film 38.

The intersecting dummy runner 132 extends from the partial runner 131-1 to the partial runner 131-2 through below the bridge portion 53 in the X axis direction. Thus, the partial runner 131-1 and the partial runner 131-2 can be connected to each other.

Figure 11:
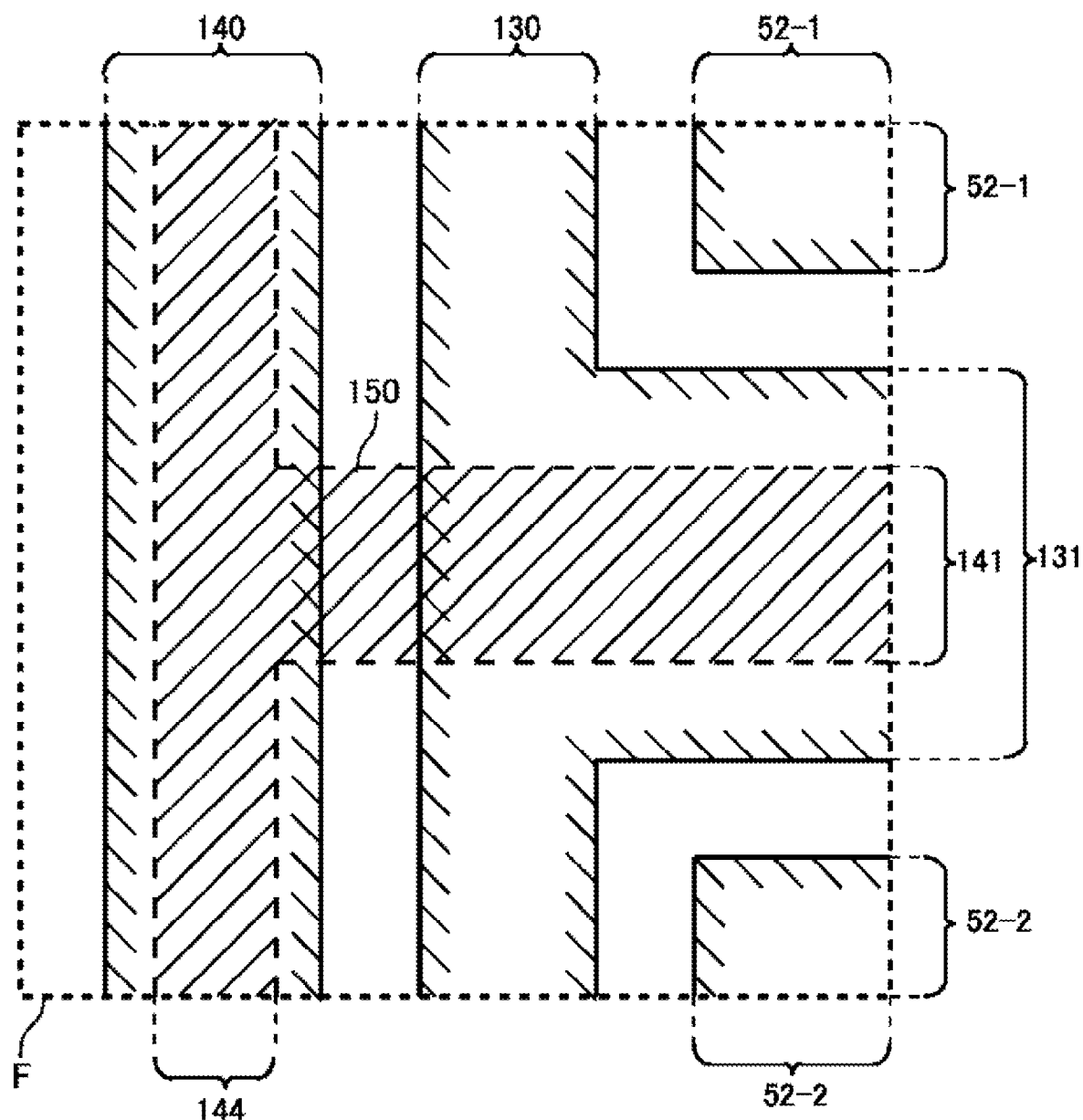
FIG. 11 is an enlarged view of a region F in FIG. 7.

FIG. 11 is an enlarged view of a region F in FIG. 7. The region F is a region in the vicinity of the portion 150 where the outer circumferential gate runner 140 and the active-side gate runner 141 connects to each other. In FIG. 11, the outer circumferential gate runner 140, the outer circumferential dummy runner 130, the active-side dummy runner 131, and the emitter electrode 52 are hatched with diagonal lines only at their ends. Further, the active-side gate runner 141 is hatched with diagonal lines in its entirety.

The outer circumferential gate runner 140 and the outer circumferential dummy runner 130 are arranged without overlapping with each other in the top plan view. The outer circumferential gate runner 140 of the present example is arranged on an outer side than the outer circumferential dummy runner 130. The outer side refers to a side distant from the active portion 120. The active-side dummy runner 131 is connected to the outer circumferential dummy runner 130. Both of the active-side dummy runner 131 and the outer circumferential dummy runner 130 of the present example are made of a metal runner.

The active-side gate runner 141 is provided traversing the outer circumferential dummy runner 130 from below the active-side dummy runner 131 to below the outer circumferential gate runner 140. The active-side gate runner 141 is connected to the outer circumferential gate runner 140 at a location where the active-side gate runner 141 overlaps with the outer circumferential gate runner 140. The active-side gate runner 141 of the present example has the portion 150 that is not covered by the dummy runner between the outer circumferential dummy runner 130 and the outer circumferential gate runner 140.

The gate runner may include a second outer circumferential runner 144 provided along the outer circumferential gate runner 140 below the outer circumferential gate runner 140. The second outer circumferential runner 144 may be formed of the same material as and at the same level as the active-side gate runner 141. The second outer circumferential runner 144 is connected to the active-side gate runner 141. The second outer circumferential runner 144 and the outer circumferential gate runner 140 are connected to each other by a contact hole provided in the interlayer dielectric film. In FIG. 11, the entirety of the second outer circumferential runner 144 is hatched with diagonal lines.

Figure 12:
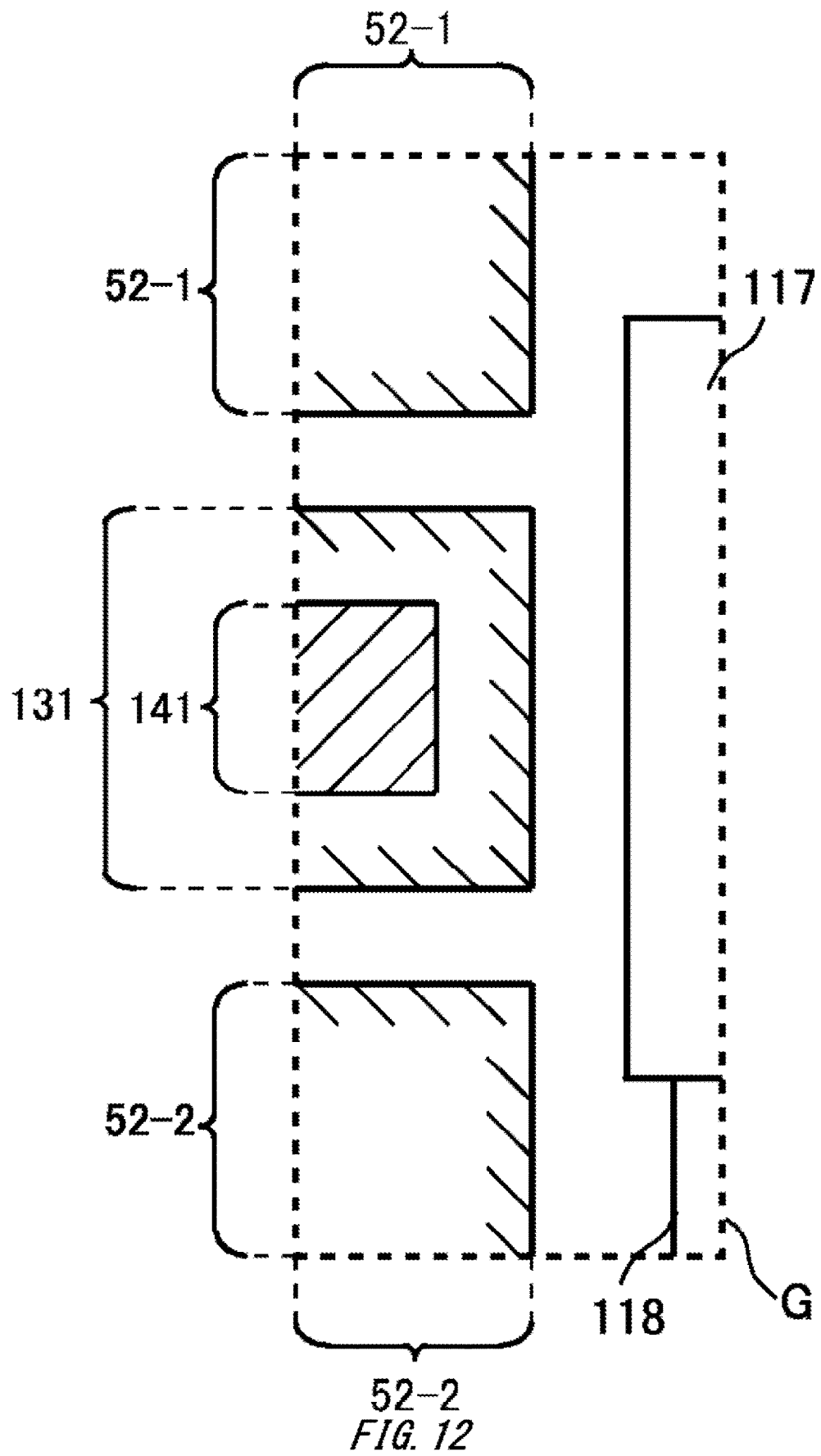
FIG. 12 is an enlarged view of a region G in FIG. 7.

FIG. 12 is an enlarged view of a region G in FIG. 7. As described above, the active-side gate runner 141 and the active-side dummy runner 131 are divided by the temperature sensing unit 117. Thus, the active-side gate runner 141 and the active-side dummy runner 131 terminate in the vicinity of the temperature sensing unit 117. The active-side dummy runner 131 may be provided closer to the temperature sensing unit 117 than the active-side gate runner 141. In other words, the distance between the active-side dummy runner 131 and the temperature sensing unit 117 may be smaller than the distance between the active-side gate runner 141 and the temperature sensing unit 117. Thus, the active-side gate runner 141 can be covered by the active-side dummy runner 131.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

It should be noted that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 18: drift region; 20: buffer region; 21: upper surface; 22: collector region; 23: lower surface; 24: collector electrode; 25: connecting portion; 29: linear portion; 30: dummy trench portion; 31: tip portion; 32: dummy dielectric film; 34: dummy conductive portion; 38: interlayer dielectric film; 40: gate trench portion; 42: gate dielectric film; 44: gate conductive portion; 52: emitter electrode; 52-1, 52-2, 52-3: partial electrode; 54, 55, 56, 57: contact hole; 60, 61: mesa portion; 70: transistor portion; 80: diode portion; 81: extension region; 82: cathode region; 90: edge termination structure portion; 100: semiconductor device; 102: edge side; 111: gate pad; 112: screening pad; 113: anode pad; 114: cathode pad; 117: temperature sensing unit; 118, 119: runner; 120: active portion; 130: outer circumferential dummy runner; 131: active-side dummy runner; 131-1, 131-2: partial runner; 132: intersecting dummy runner; 140: outer circumferential gate runner; 141: active-side gate runner; 144: second outer circumferential runner; 150: portion

What is claimed is:

1. A semiconductor device comprising:
a semiconductor substrate;
an emitter electrode including at least two partial electrodes arranged with an interval in a top plan view of the semiconductor substrate; and
an active-side gate runner and an active-side dummy runner arranged to be sandwiched between two of the partial electrodes,
wherein the semiconductor substrate includes:
a gate trench portion connected to the active-side gate runner and having a longitudinal length in a first direction in the top plan view; and
a dummy trench portion connected to the active-side dummy runner and having a longitudinal length in the first direction, and
wherein the entirety of one of the active-side gate runner and the active-side dummy runner in the first direction is covered by the other of the active-side gate runner and the active-side dummy runner.

2. The semiconductor device according to claim 1, wherein the entirety of the active-side gate runner in the first direction is covered by the active-side dummy runner arranged above the active-side gate runner.

3. The semiconductor device according to claim 2, wherein the active-side dummy runner is connected to the dummy trench portion at a portion that does not overlap the active-side gate runner.

4. The semiconductor device according to claim 3, wherein the active-side gate runner is a runner made of a semiconductor material, and the active-side dummy runner is a runner made of a metal material.

5. The semiconductor device according to claim 4,
wherein the emitter electrode has a bridge portion connecting two of the partial electrodes,
wherein the active-side dummy runner is divided into at least two partial runners by the bridge portion, and
wherein the semiconductor device further comprises an intersecting dummy runner made of a semiconductor material, which is provided intersecting with the bridge portion and connects two of the partial runners.

6. The semiconductor device according to claim 5, wherein the intersecting dummy runner is connected to the dummy trench portion.

7. The semiconductor device according to claim 6,
wherein the semiconductor substrate has a transistor portion in which the gate trench portion and the dummy trench portion are provided and a diode portion in which the dummy trench portion is provided, and
wherein the intersecting dummy runner is connected to the dummy trench portion of the diode portion.

8. The semiconductor device according to claim 2, wherein the active-side gate runner is a runner made of a semiconductor material, and the active-side dummy runner is a runner made of a metal material.

9. The semiconductor device according to claim 8,
wherein the emitter electrode has a bridge portion connecting two of the partial electrodes,
wherein the active-side dummy runner is divided into at least two partial runners by the bridge portion, and
wherein the semiconductor device further comprises an intersecting dummy runner made of a semiconductor material, which is provided intersecting with the bridge portion and connects two of the partial runners.

10. The semiconductor device according to claim 9, wherein the intersecting dummy runner is connected to the dummy trench portion.

11. The semiconductor device according to claim 10,
wherein the semiconductor substrate has a transistor portion in which the gate trench portion and the dummy trench portion are provided and a diode portion in which the dummy trench portion is provided, and
wherein the intersecting dummy runner is connected to the dummy trench portion of the diode portion.

12. The semiconductor device according to claim 1, wherein the active-side gate runner is a runner made of a semiconductor material, and the active-side dummy runner is a runner made of a metal material.

13. The semiconductor device according to claim 12,
wherein the emitter electrode has a bridge portion connecting two of the partial electrodes,
wherein the active-side dummy runner is divided into at least two partial runners by the bridge portion, and
wherein the semiconductor device further comprises an intersecting dummy runner made of a semiconductor material, which is provided intersecting with the bridge portion and connects two of the partial runners.

14. The semiconductor device according to claim 13, wherein the intersecting dummy runner is connected to the dummy trench portion.

15. The semiconductor device according to claim 14, wherein the semiconductor substrate has a transistor portion in which the gate trench portion and the dummy trench portion are provided and a diode portion in which the dummy trench portion is provided, and
wherein the intersecting dummy runner is connected to the dummy trench portion of the diode portion.

16. The semiconductor device according to claim 15, wherein the dummy trench portion of the transistor portion is connected to the active-side dummy runner.

17. The semiconductor device according to claim 13, wherein the active-side gate runner is provided intersecting with the bridge portion.

18. The semiconductor device according to claim 1, further comprising an interlayer dielectric film provided between the semiconductor substrate and the emitter electrode and having a contact hole connecting the emitter electrode to the semiconductor substrate,
wherein the active-side dummy runner is provided in a range that does not overlap with the contact hole in the top plan view of the semiconductor substrate.

19. The semiconductor device according to claim 1, further comprising:
an outer circumferential gate runner arranged between the emitter electrode and an edge side of the semiconductor substrate in the top plan view and connected to the active-side gate runner; and
an outer circumferential dummy runner arranged between the emitter electrode and the edge side of the semiconductor substrate in the top plan view and connected to the active-side dummy runner,
wherein the outer circumferential gate runner and the outer circumferential dummy runner are arranged without overlapping with each other in the top plan view of the semiconductor substrate.

20. The semiconductor device according to claim 19, further comprising a screening pad connected to the outer circumferential dummy runner.

* * * * *